United States Patent
Hanamaki et al.

(10) Patent No.: US 7,682,857 B2
(45) Date of Patent: Mar. 23, 2010

(54) METHOD FOR MANUFACTURING SEMICONDUCTOR OPTICAL DEVICE

(75) Inventors: Yoshihiko Hanamaki, Tokyo (JP); Takehiro Nishida, Tokyo (JP); Makoto Takada, Hyogo (JP); Kenichi Ono, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 84 days.

(21) Appl. No.: 12/019,665

(22) Filed: Jan. 25, 2008

(65) Prior Publication Data
US 2008/0254563 A1 Oct. 16, 2008

(30) Foreign Application Priority Data
Apr. 16, 2007 (JP) ............................... 2007-106940
Aug. 27, 2007 (JP) ............................... 2007-219687

(51) Int. Cl.
*H01L 21/00* (2006.01)
(52) U.S. Cl. ................. 438/30; 438/603; 438/604; 438/606; 438/681; 257/E21.17; 257/E21.053; 257/E21.085; 257/E21.126; 257/E21.135
(58) Field of Classification Search .................. 438/30, 438/48, 602, 604, 606, 603, 681, 743, 753, 438/756, 508, 475
See application file for complete search history.

(56) References Cited

U.S. PATENT DOCUMENTS

| 5,260,959 | A | | 11/1993 | Hayakawa | |
|---|---|---|---|---|---|
| 5,574,743 | A | * | 11/1996 | van der Poel et al. | 372/46 |
| 5,577,063 | A | * | 11/1996 | Nagai et al. | 372/46.016 |
| 5,682,045 | A | | 10/1997 | Hayafuji et al. | |
| 6,803,604 | B2 | * | 10/2004 | Takahashi et al. | 257/80 |
| 6,876,688 | B1 | | 4/2005 | Hayakawa et al. | |
| 6,884,648 | B2 | * | 4/2005 | Hasegawa et al. | 438/46 |
| 6,888,870 | B2 | * | 5/2005 | Makita et al. | 372/46 |
| 6,958,493 | B2 | * | 10/2005 | Hasegawa et al. | 257/79 |

FOREIGN PATENT DOCUMENTS

| JP | 5-29700 | 2/1993 |
|---|---|---|
| JP | 5-235470 | 9/1993 |
| JP | 8-83902 | 3/1996 |
| JP | 10-261835 | 9/1998 |
| JP | 11-330607 | 11/1999 |
| JP | 2000-101198 | 4/2000 |
| JP | 2005-166817 | 6/2005 |

* cited by examiner

*Primary Examiner*—David Nhu
(74) *Attorney, Agent, or Firm*—Leydig, Voit & Mayer, Ltd.

(57) ABSTRACT

A method for manufacturing a semiconductor optical device includes: forming a p-type cladding layer; forming a capping layer on the p-type cladding layer, the capping layer being selectively etchable relative to the p-type cladding layer; forming a through film on the capping layer; forming a window structure by ion implantation; removing the through film after the ion implantation; and selectively removing the capping layer using a chemical solution.

14 Claims, 10 Drawing Sheets

| No | name of layer | material | dopant | carrier density (E18/cm$^3$) | thickness (nm) |
|---|---|---|---|---|---|
| 11 | resist | | | ------- | 1000-3000 |
| 10 | through layer(film) | SiO2 | | ------- | 200-600 |
| 9 | capping layer | InGaP | | ------- | 5-15 |
| 8 | p-cladding layer | AlGaAs | Zn | 1.0-2.0 | 100-200 |
| 7 | guiding layer | AlGaAs | | ------- | 5-20 |
| 6 | well layer | AlGaAs | | ------- | 5-10 |
| 5 | guiding layer | AlGaAs | | ------- | 5-20 |
| 4 | n-cladding layer | AlGaAs | Si | 0.05-0.2 | 50-200 |
| 3 | n-cladding layer | InGaP | Si | 0.1-0.5 | 1000-4000 |
| 2 | buffer layer | GaAs | Si | 0.5-2.0 | 200-700 |
| 1 | substrate | GaAs | Si | 0.7-1.0 | |

FIG.1

| No | name of layer | material | dopant | carrier density (E18/cm$^3$) | thickness (nm) |
|---|---|---|---|---|---|
| 8 | p-cladding layer | AlGaAs | Zn | 1.0-2.0 | 100-200 |
| 7 | guiding layer | AlGaAs | | ------- | 5-20 |
| 6 | well layer | AlGaAs | | ------- | 5-10 |
| 5 | guiding layer | AlGaAs | | ------- | 5-20 |
| 4 | n-cladding layer | AlGaAs | Si | 0.05-0.2 | 50-20 |
| 3 | n-cladding layer | InGaP | Si | 0.1-0.5 | 1000-4000 |
| 2 | buffer layer | GaAs | Si | 0.5-2.0 | 200-700 |
| 1 | substrate | GaAs | Si | 0.7-1.0 | |

FIG.2

| No | name of layer | material | dopant | carrier density (E18/cm$^3$) | thickness (nm) |
|---|---|---|---|---|---|
| 16 | p-contact layer | GaAs | C | 20.0-40.0 | 100-400 |
| 15 | p-BDR layer | InGaP | Mg | 3.0-6.0 | 10-60 |
| 14 | p-cladding layer | AlGaInP | Mg | 0.5-3.0 | 500-1500 |
| 13 | p-cladding layer | InGaP | Mg | 0.5-3.0 | 10-100 |
| 12 | p-cladding layer | AlGaAs | Zn | 1.0-2.0 | 5-20 |
| 8 | p-cladding layer | AlGaAs | Zn | 1.0-2.0 | 100-200 |
| 7 | guiding layer | AlGaAs | | ------- | 5-20 |
| 6 | well layer | AlGaAs | | ------- | 5-10 |
| 5 | guiding layer | AlGaAs | | ------- | 5-20 |
| 4 | n-cladding layer | AlGaAs | Si | 0.05-0.2 | 50-200 |
| 3 | n-cladding layer | InGaP | Si | 0.1-0.5 | 1000-4000 |
| 2 | buffer layer | GaAs | Si | 0.5-2.0 | 200-700 |
| 1 | substrate | GaAs | Si | 0.7-1.0 | |

FIG.3

| No | name of layer | material | dopant | carrier density (E18/cm³) | thickness (nm) |
|---|---|---|---|---|---|
| 30 | resist | | | ------- | 1000-3000 |
| 29 | through layer(film) | SiO2 | | ------- | 200-600 |
| 28 | capping layer | GaAs | | ------- | 2-8 |
| 27 | p-cladding layer | AlGaAs | Zn | 1.0-2.0 | 100-200 |
| 26 | guiding layer | AlGaAs | | ------- | 5-20 |
| 25 | well layer | AlGaAs | | ------- | 5-10 |
| 24 | guiding layer | AlGaAs | | ------- | 5-20 |
| 23 | n-cladding layer | AlGaAs | Si | 0.05-0.2 | 50-200 |
| 22 | n-cladding layer | InGaP | Si | 0.1-0.5 | 1000-4000 |
| 21 | buffer layer | GaAs | Si | 0.5-2.0 | 200-700 |
| 20 | substrate | GaAs | Si | 0.7-1.0 | |

| No | name of layer | material | dopant | carrier density (E18/cm³) | thickness (nm) |
|---|---|---|---|---|---|
| 27 | p-cladding layer | AlGaAs | Zn | 1.0-2.0 | 100-200 |
| 26 | guiding layer | AlGaAs | | ------- | 5-20 |
| 25 | well layer | AlGaAs | | ------- | 5-10 |
| 24 | guiding layer | AlGaAs | | ------- | 5-20 |
| 23 | n-cladding layer | AlGaAs | Si | 0.05-0.2 | 50-200 |
| 22 | n-cladding layer | InGaP | Si | 0.1-0.5 | 1000-4000 |
| 21 | buffer layer | GaAs | Si | 0.5-2.0 | 200-700 |
| 20 | substrate | GaAs | Si | 0.7-1.0 | |

FIG.6

| No | name of layer | material | dopant | carrier density (E18/cm³) | thickness (nm) |
|---|---|---|---|---|---|
| 35 | p-contact layer | GaAs | C | 20.0-40.0 | 100-400 |
| 34 | p-BDR layer | InGaP | Zn | 3.0-6.0 | 10-60 |
| 33 | p-cladding layer | AlGaInP | Mg | 0.5-3.0 | 500-1500 |
| 32 | p-cladding layer | InGaP | Mg | 0.5-3.0 | 10-100 |
| 31 | p-cladding layer | AlGaAs | Zn | 1.0-2.0 | 5-20 |
| 27 | p-cladding layer | AlGaAs | Zn | 1.0-2.0 | 100-200 |
| 26 | guiding layer | AlGaAs | | ------- | 5-20 |
| 25 | well layer | AlGaAs | | ------- | 5-10 |
| 24 | guiding layer | AlGaAs | | ------- | 5-20 |
| 23 | n-cladding layer | AlGaAs | Si | 0.05-0.2 | 50-200 |
| 22 | n-cladding layer | InGaP | Si | 0.1-0.5 | 1000-4000 |
| 21 | buffer layer | GaAs | Si | 0.5-2.0 | 200-700 |
| 20 | substrate | GaAs | Si | 0.7-1.0 | |

FIG.7

| No | name of layer | material | dopant | carrier density (E18/cm³) | thickness (nm) |
|---|---|---|---|---|---|
| 51 | resist | | | ------- | 1000-3000 |
| 50 | through layer(film) | SiO2 | | ------- | 200-600 |
| 49 | first capping layer | GaAs | | ------- | 2-8 |
| 48 | second capping layer | InGaP | | ------- | 5-15 |
| 47 | p-cladding layer | AlGaAs | Zn | 1.0-2.0 | 100-200 |
| 46 | guiding layer | AlGaAs | | ------- | 5-20 |
| 45 | well layer | AlGaAs | | ------- | 5-10 |
| 44 | guiding layer | AlGaAs | | ------- | 5-20 |
| 43 | n-cladding layer | AlGaAs | Si | 0.05-0.2 | 50-200 |
| 42 | n-cladding layer | InGaP | Si | 0.1-0.5 | 1000-4000 |
| 41 | buffer layer | GaAs | Si | 0.5-2.0 | 200-700 |
| 40 | substrate | GaAs | Si | 0.7-1.0 | |

FIG.10

| No | name of layer | material | dopant | carrier density (E18/cm³) | thickness (nm) |
|---|---|---|---|---|---|
| 47 | p-cladding layer | AlGaAs | Zn | 1.0-2.0 | 100-200 |
| 46 | guiding layer | AlGaAs | | ------- | 5-20 |
| 45 | well layer | AlGaAs | | ------- | 5-10 |
| 44 | guiding layer | AlGaAs | | ------- | 5-20 |
| 43 | n-cladding layer | AlGaAs | Si | 0.05-0.2 | 50-200 |
| 42 | n-cladding layer | InGaP | Si | 0.1-0.5 | 1000-4000 |
| 41 | buffer layer | GaAs | Si | 0.5-2.0 | 200-700 |
| 40 | substrate | GaAs | Si | 0.7-1.0 | |

FIG.11

| No | name of layer | material | dopant | carrier density (E18/cm³) | thickness (nm) |
|----|---------------|----------|--------|---------------------------|----------------|
| 56 | p-contact layer | GaAs | C | 20.0-40.0 | 100-400 |
| 55 | p-BDR layer | InGaP | Mg | 3.0-6.0 | 10-60 |
| 54 | p-cladding layer | AlGaInP | Mg | 0.5-3.0 | 500-1500 |
| 53 | p-cladding layer | InGaP | Mg | 0.5-3.0 | 10-100 |
| 52 | p-cladding layer | AlGaAs | Zn | 1.0-2.0 | 5-10 |
| 47 | p-cladding layer | AlGaAs | Zn | 1.0-2.0 | 100-200 |
| 46 | guiding layer | AlGaAs | ------ | ------ | 5-20 |
| 45 | well layer | AlGaAs | ------ | ------ | 5-10 |
| 44 | guiding layer | AlGaAs | ------ | ------ | 5-20 |
| 43 | n-cladding layer | AlGaAs | Si | 0.05-0.2 | 50-200 |
| 42 | n-cladding layer | InGaP | Si | 0.1-0.5 | 1000-4000 |
| 41 | buffer layer | GaAs | Si | 0.5-2.0 | 200-700 |
| 40 | substrate | GaAs | Si | 0.7-1.0 | |

FIG.12

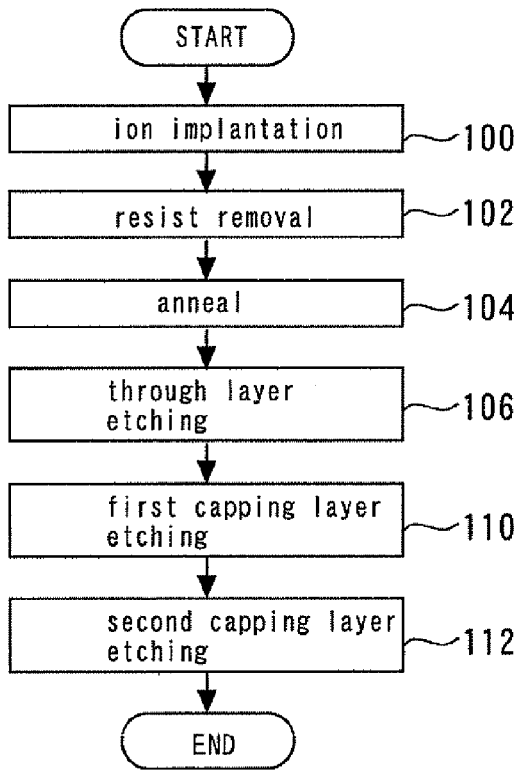

FIG.13

METHOD FOR MANUFACTURING SEMICONDUCTOR OPTICAL DEVICE

FIELD OF THE INVENTION

The present invention relates to a method for manufacturing a semiconductor optical device.

BACKGROUND ART

Writing to a CD-R, DVD-R, etc. requires a high power semiconductor optical device. However, it has been difficult to increase the output power of a laser diode (a semiconductor optical device), since that may result in damage to the end faces of the device. (Such damage is referred to as "catastrophic optical damage" or "COD.") A common method for avoiding this problem has been to disorder the end faces of the well structure of the laser diode to prevent light absorption of these end faces and thereby prevent damage to them. A disordered end face of a well structure is referred to as a "window structure." A window structure is formed by ion implantation, as described in Japanese Laid-Open Patent Publication No. 2000-101198. The method for forming window structures disclosed in this patent publication implants ions in the end faces of the well structure through the overlying GaAs capping layer and oxide film layer.

Incidentally, fluorine-based gas is used to maintain the coating apparatus used in manufacturing processes for semiconductor optical devices. The environment surrounding the manufacturing line also contains fluorine. The penetration of fluorine into a semiconductor optical device generally results in degradation of its characteristics. Japanese Laid-Open Patent Publication No. 8-83902 (1996) discloses a method of removing this fluorine from the device by heat treatment to prevent the degradation of its characteristics. Other prior art includes Japanese Laid-Open Patent Publication Nos. 2005-166817, 11-330607 (1999), 5-29700 (1993), 5-235470 (1993), and 10-261835 (1998).

Conventional manufacturing methods for semiconductor optical devices have two problems. The first problem relates to the formation of the window structure described above. Specifically, the conventional window structure forming process disclosed in Japanese Laid-Open Patent Publication No. 2000-101198 noted above does not remove the GaAs capping layer that has been used to form window structures by ion implantation, and grows an additional p-type cladding layer over this layer. That is, the GaAs capping layer remains in the completed optical device. It is desirable to remove the GaAs capping layer (by etching) after the ion implantation, since band discontinuity occurs between this layer and the overlying p-type cladding layer. However, the GaAs capping layer may be difficult to completely etch away without a problem, since it is difficult to increase the etch selectivity of the GaAs capping layer to the underlying cladding layer. Specifically, some residual material from the GaAs capping layer may remain on the exposed surface of the cladding layer after the etching of the capping layer, thereby preventing the surface from being clean. It has happened that such residual material has caused crystal defects, etc. in the subsequent crystal growth process.

The second problem is the penetration of fluorine into a semiconductor optical device during its manufacture, as described above. It may not be possible to completely or sufficiently remove such fluorine from Al-containing active and cladding layers and thereby prevent crystal defects and crystal transitions, even by the fluorine removing method described in the above Japanese Laid-Open Patent Publication No. 8-83902, resulting in degraded characteristics and reliability of the semiconductor optical device.

SUMMARY OF THE INVENTION

The present invention has been devised to solve the above problems. It is, therefore, an object of the present invention to provide a method for manufacturing a semiconductor optical device while preventing degradation of its characteristics and reliability.

According to one aspect of the present invention, a method for manufacturing a semiconductor optical device, includes:

a p-type cladding layer forming step of forming a p-type cladding layer;

a capping layer forming step of forming a capping layer on the p-type cladding layer after the p-type cladding layer forming step, the capping layer being able to be selectively etched relative to the p-type cladding layer;

a through film forming step of forming a through film on the capping layer after the capping layer forming step;

an ion implanting step of forming a window structure by ion implantation after the through film forming step;

a through film etching step of removing the through film after the ion implanting step; and a capping layer etching step of selectively removing the capping layer after the through film etching step.

According to another aspect of the present invention, a method for manufacturing a semiconductor optical device, includes:

a p-type cladding layer forming step of forming a p-type cladding layer;

a second capping layer forming step of forming a second capping layer on the p-type cladding layer after the p-type cladding layer forming step, the second capping layer being able to be selectively etched relative to the p-type cladding layer;

a first capping layer forming step of, after the second capping layer forming step, forming a first capping layer on the second capping layer to prevent a material constituting the second capping layer from leaving the second capping layer, the first capping layer being able to be selectively etched relative to the second capping layer;

a through film forming step of forming a through film on the first capping layer after the first capping layer forming step;

an ion implanting step of forming a window structure by ion implantation after the through film forming step;

a through film etching step of removing the through film after the ion implanting step;

a first capping layer etching step of selectively removing the first capping layer after the through film etching step; and a second capping layer etching step of selectively removing the second capping layer after the first capping layer etching step.

According to another aspect of the present invention, a method for manufacturing a semiconductor optical device, includes:

an active layer forming step of forming an active layer;

an active layer-protecting film-forming step of forming a phosphorus based Group III-V semiconductor layer after the active layer forming step; and a silicon based film forming step of forming a silicon oxide based film or a silicon nitride based film after the active layer-protecting film-forming step.

Other and further objects, features and advantages of the invention will appear more fully from the following description.

BRIEF DESCRIPTION OF THE DRAWINGS

FIG. 1 specifies the layers of the semiconductor structure before forming window structures in it;

FIG. 2 specifies the layers of the semiconductor structure after the window structures are formed in it and before the semiconductor structure is regrown;

FIG. 3 specifies the layers of the semiconductor structure after the regrowth;

FIG. 6 specifies the layers of the semiconductor structure explaining a comparative method for manufacturing a semiconductor optical device with window structures;

FIG. 7 specifies the layers of the semiconductor structure manufactured by comparative method;

FIG. 10 specifies the layers of the semiconductor structure of second embodiment before forming window structures;

FIG. 11 specifies the layers of the semiconductor structure of second embodiment after the window structures are formed in it and before the semiconductor structure is regrown;

FIG. 12 specifies the layers of the semiconductor structure of second embodiment after the regrowth;

FIG. 13 is flow chart explaining second embodiment;

DETAILED DESCRIPTION OF THE PREFERRED EMBODIMENTS

First Embodiment

Figures 4, 5:
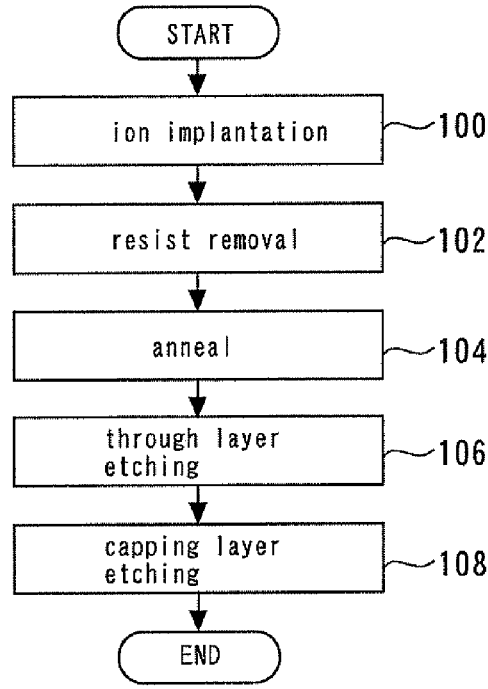
FIG. 4 shows window structure forming process.
FIG. 5 specifies the layers of the semiconductor structure explaining a comparative method for manufacturing a semiconductor optical device with window structures.

A first embodiment of the present invention provides a method for manufacturing a semiconductor optical device by MOCVD (Metal Organic Chemical Vapor Deposition). Specifically, semiconductor layers are formed on top of one another over a semiconductor substrate at a growth temperature of 720° C., etc. under a growth pressure of 100 mbar, etc. The source gases used to form each layer include trimethyl indium (TMI), trimethyl gallium (TMG), trimethyl aluminum (TMA), phosphine ($PH_3$), arsine ($AsH_3$), silane ($SiH_4$), cyclopentadienyl magnesium ($Cp_2Mg$), dimethyl zinc (DMZn), and diethyl zinc (DEZn). The desired composition of each layer is obtained by mixing these source gases with hydrogen gas and then supplying them while controlling their flow rates using mass flow controllers (MFCs), etc. The p-contact layer (described later) is doped with C (carbon) by adjusting the mole ratio of $AsH_3$ to TMG to approximately 1 at a growth temperature of 540° C. That is, the p-contact layer (a GaAs layer) is doped with carbon generated from a metalorganic source (i.e., TMG) used to grow the p-contact layer itself. This doping technique is referred to as "intrinsic doping." It is to be understood that the crystal growth methods, growth conditions, and source gases described above are illustrative only, and the invention is not limited thereto.

FIGS. 1, 2, and 3 are tables illustrating the method for manufacturing a semiconductor optical device according to the present embodiment. This method is characterized by a window structure forming process. The tables of FIGS. 1 to 3 illustrate stages in the process of fabricating the semiconductor optical device. Specifically, FIG. 1 specifies the layers of the semiconductor structure formed by the method before forming window structures in it; FIG. 2 specifies the layers of the semiconductor structure after the window structures are formed in it and before the semiconductor structure is regrown; and FIG. 3 specifies the layers of the semiconductor structure after the regrowth. In each figure, the sequential numbers along the left side of the table indicate the order in which the layers are formed on top of one another, with the substrate being numbered 1. That is, higher-numbered layers are above lower-numbered layers in the structure.

The table of FIG. 1 specifies the layers of the semiconductor structure formed by the method before forming window structures in it, as described above. Each layer in this semiconductor structure will now be described. Referring to FIG. 1, the substrate 1 is a GaAs substrate doped with Si. A buffer layer 2 of GaAs doped with Si is formed on the substrate 1 to enhance the crystallinity of the device formed on the substrate 1 later in the process. An n-cladding layer 3 of InGaP doped with Si is then formed on the buffer layer 2. According to the present invention, the n-cladding layer 3 may be made of AlGaInP instead of InGaP. An n-cladding layer 4 of AlGaAs is then formed on the n-cladding layer 3. The n-cladding layer 4 is doped with Si. The cladding layers are provided primarily to increase the carrier density of the guiding layers and the quantum well layer (formed later in the process) and confine light within the active layer. It should be noted that the above-described layers from the substrate 1 through the n-cladding layer 4 may be doped with n-type dopants other than Si.

Next, a guiding layer 5 of AlGaAs is formed on the n-cladding layer 4, and a well layer 6 of AlGaAs is formed on the guiding layer 5. A guiding layer 7 of AlGaAs is then formed on the well layer 6. Thus, the semiconductor optical device of the present embodiment includes the well structure made up of the guiding layer 5, the well layer 6, and the guiding layer 7 and has an optical bandgap corresponding to a PL wavelength of 775-785 nm. It should be noted that the above well structure (having a PL wavelength of 775-785 nm and made up of the guiding layers 5 and 7 and the well layer 6 sandwiched therebetween) may be formed of any suitable material or combination of materials. Further, although the semiconductor optical device of the present embodiment has been described as having a single quantum well structure, it may have a multiquantum well structure.

A p-cladding layer 8 of AlGaAs doped with Zn is then formed on the guiding layer 7. It should be noted that instead of Zn use may be made of other p-type dopants such as Mg, Be, and C. In the following description, some layers will be described as being doped with Mg. However, they may be doped with other p-type dopants. Next, a capping layer 9 of InGaP is formed on the p-cladding layer 8, and a through layer 10 of $SiO_2$ is formed on the capping layer 9. The composition of the capping layer 9 is such that the overlying through layer 10 can be selectively etched relative to the capping layer 9, and the capping layer 9 can be selectively etched relative to underlying p-cladding layer 8. The thickness of the capping layer 9 should preferably be 15 nm or less in order to facilitate the ion implantation for forming the window structures (described later). Instead of $SiO_2$, the through layer 10 may be made of any material having the same function as $SiO_2$, such as SiO or SiON. Thus, the through layer 10 and the p-cladding layer 8 are separated from each other by the capping layer 9. Next, a resist 11 is formed on the $SiO_2$ layer 10, and portions of the resist 11 are removed by photoengraving to expose the areas of the $SiO_2$ layer 10 where the window structures are to be formed.

After forming the semiconductor structure as shown in FIG. 1, the method forms window structures. This window structure forming process will be described with reference to FIG. 4. (It should be noted that FIG. 1 specifies the layers of the semiconductor structure formed by the method before forming the window structures and FIG. 2 specifies the layers of the semiconductor structure after the window structures are formed in it.) First, an ion implantation step (step 100) is carried out to implant the substrate with $Si^+$ (or silicon ions). Specifically, in this step, $Si^+$ is implanted in the exposed areas of the $SiO_2$ layer 10 where the window structures are to be formed. Next, the resist is removed at step 102. At step 104, the wafer is annealed at 760° C. for approximately 60 minutes to increase the effective optical bandgap and thereby form the window structures. Specifically, the ion-implanted regions of the quantum well structure made up of the guiding layer 5, the well layer 6, and the guiding layer 7 are disordered to form window structures. Next, a through layer etching step (step 106) is carried out to etch the through layer 10. Specifically, the wafer is immersed in buffered hydrofluoric acid (BHF) at room temperature for approximately 12 minutes to remove the through layer 10. With this, the through layer 10 is etched away with high selectivity relative to the underlying capping layer 9. After removing the through layer 10, the capping layer 9 is etched using hydrochloric acid at step 108. Since the capping layer 9 is composed of InGaP, it can be selectively etched relative to the cladding layer 8 by hydrochloric acid. The resultant exposed surface of the p-cladding layer 8, i.e., the surface of the wafer, is clean. Thus, the process shown in FIG. 4 forms window structures whose layers are specified in FIG. 2.

After forming the semiconductor structure specified in FIG. 2, the method further forms layers over it to produce the semiconductor structure specified in FIG. 3. This process will now be described with reference to FIG. 3. Firsts a p-cladding layer 12 of AlGaAs doped with Zn is formed on the p-cladding layer 8. Next, a p-cladding layer 13 of InGaP doped with Mg is formed on the p-cladding layer 12. A p-cladding layer 14 of AlGaInP doped with Mg is then formed on the p-cladding layer 13. A p-BDR layer 15 of InGaP doped with Mg is then formed on the p-cladding layer 14, and a p-contact layer 16 of GaAs doped with C is formed on the p-BDR layer 15. The p-BDR layer 15 is provided to reduce the band discontinuity between the p-cladding layer 14 and the p-contact layer 16.

To better understand the features of the present invention, it will be helpful to describe a comparative method for manufacturing a semiconductor optical device with window structures, with reference to FIGS. 5 to 7. FIG. 1 specifies the layers of the semiconductor structure formed by this manufacturing method before forming the window structures; FIG. 6 specifies the layers of the semiconductor structure after the window structures are formed in it and before the semiconductor structure is regrown; and FIG. 7 specifies the layers of the semiconductor structure after the regrowth. The semiconductor structure shown in FIG. 5 differs from that shown in FIG. 1 in that the capping layer (28) is formed of GaAs instead of InGaP. This capping layer is also removed after the window structures are formed and before the regrowth of the semiconductor structure, as in the first embodiment. Specifically, the wafer is immersed in a mixture of tartaric acid, hydrogen peroxide solution, and purified water in the ratio of 20:10:100 (hereinafter referred to as "comparative mixed solution") for approximately 15 seconds to remove the capping layer 28. This well known removal technique is disclosed in Japanese Laid-Open Patent Publication No. 10-261835 noted above. However, this technique is disadvantageous in that the above comparative mixed solution cannot etch a GaAs layer with high selectivity, meaning that residual material may be left on the surface of the p-cladding layer 27 after the removal of the capping layer 28. This may degrade the flatness of the surface and thereby cause the subsequent regrown layer to have crystal defects, clouded portions, etc.

On the other hand, the manufacturing method of the present embodiment enables the capping layer to be etched away by hydrochloric acid (at step 108) such that the resultant exposed surface of the p-cladding layer 28 is clean. The reason for this is that the capping layer (9) of the present embodiment is made of InGaP, which can be selectively etched by hydrochloric acid. Therefore, the method of the present embodiment does not suffer the problem of crystal defects in layers, etc. and the resultant reduction in the yield of the semiconductor optical device encountered by the above comparative manufacturing method. Since the method of the present embodiment includes no more process steps than the comparative method, no increase in manufacturing cost results.

Although the capping layer has been described as being made of InGaP, the layer may be formed of any suitable material that allows it to be selectively etched relative to the underlying cladding layer. Further, although the capping layer has been described as being etched using hydrofluoric acid, the layer may be etched by any suitable chemical solution or etchant that allows it to be selectively etched relative to the underlying cladding layer.

Figure 8:
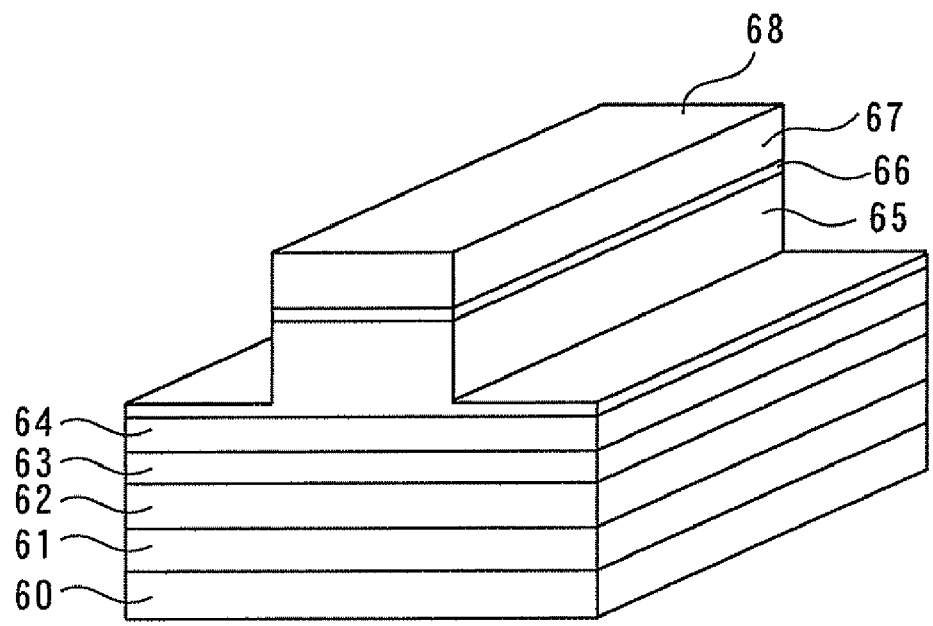
FIG. 8 shows ridge waveguide lasers.
Figure 9:
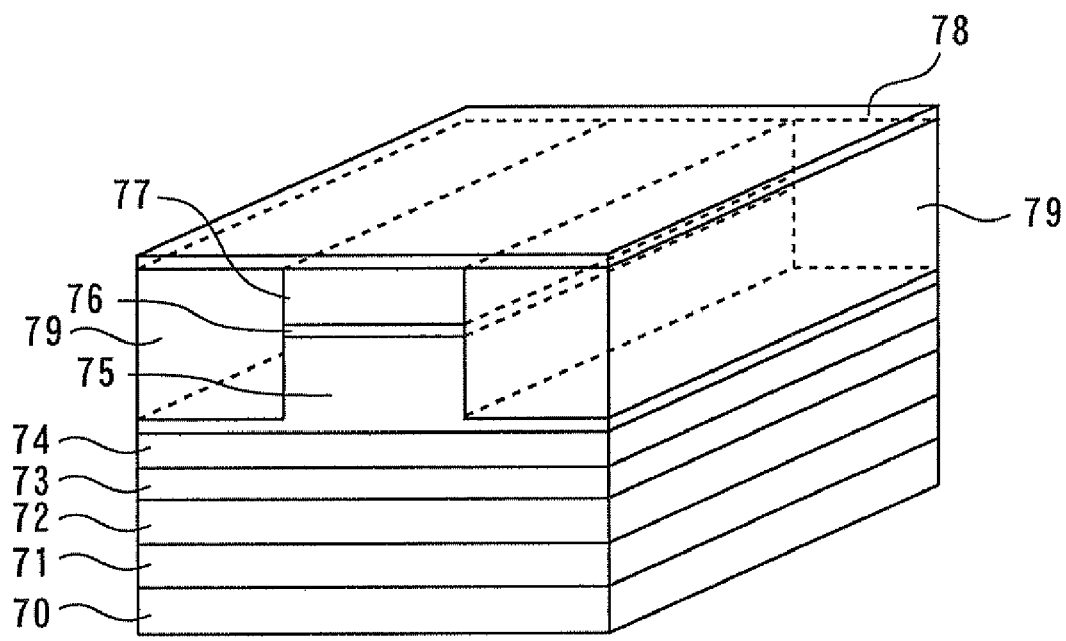
FIG. 9 shows buried lasers with a current constricting structure.

The above method of the present invention for manufacturing a semiconductor optical device can be applied to ridge waveguide lasers, such as that shown in FIG. 8, and to buried lasers with a current constricting structure, such as that shown in FIG. 9. The ridge waveguide laser shown in FIG. 8 includes an n-type electrode 60, an n-type GaAs (InP) substrate 61, an n-type buffer layer 62, an n-type cladding layer 63, a quantum well structure 64, a p-type cladding layer 65, a BDR layer 66, a p-type contact layer 67, and a p-type electrode 68. The buried laser shown in FIG. 9 includes an n-type electrode 70, an n-type GaAs (InP) substrate 71, an n-type buffer layer 72, an n-type cladding layer 73, a quantum well structure 74, a p-type cladding layer 75, a BDR layer 76, a p-type contact layer 77, a p-type electrode 78, and an n-type current blocking layer 79. It should be noted, however, that the present invention is not limited to lasers but can be applied to other semiconductor optical devices such as LEDs (Light Emitting Diodes), with the same effect.

Second Embodiment

A second embodiment of the present invention provides a method for manufacturing a semiconductor optical device including first and second capping layers. This manufacturing method uses the same crystal growth technique and conditions and source gases as described in connection with the first embodiment. FIGS. 10, 11, and 12 are tables illustrating stages in the process of fabricating the semiconductor optical device. Specifically, FIG. 10 specifies the layers of the semiconductor structure formed by the method before forming window structures; FIG. 11 specifies the layers of the semiconductor structure after the window structures are formed in it and before the semiconductor structure is regrown; and FIG. 12 specifies the layers of the semiconductor structure after the regrowth. The semiconductor structure formed by the manufacturing method of the present embodiment before forming the window structures differs from that (shown in FIG. 1) formed by the method of the first embodiment in that the capping layer 9 is replaced by a first capping layer 49 and a second capping layer 48. The first capping layer 49 is made of GaAs and can be selectively etched relative to the underlying second capping layer 48. The first capping layer 49 is provided to prevent phosphorus (P) from leaving the underlying layer. The second capping layer 48 is made of InGaP and can be selectively etched relative to the underlying p-cladding layer 47. Thus, the second capping layer 48 is provided between the first capping layer 49 and the p-cladding layer 47 primarily to allow the first capping layer 49 to be completely etched away.

After forming the semiconductor structure specified in FIG. 10, the method further forms layers over it to produce the semiconductor structure specified in FIG. 11. This process will now be described with reference to FIG. 13. Since steps 100 through 106 are the same as those shown in FIG. 4 described in connection with the first embodiment, a description thereof is not provided herein. At step 110, the first capping layer 49 is etched away using an ammonium hydroxide/peroxide mixture. This etchant can selectively etch the first capping layer 49 relative to the second capping layer 48, since the first capping layer 49 is made of GaAs, as described above.

Next, a second capping layer etching step (step 112) is carried out to remove the second capping layer 48 using hydrochloric acid. This etchant can selectively etch the second capping layer 48 relative to the underlying p-cladding layer 47, since the second capping layer 48 is made of InGaP. Thus, both the first capping layer 49 and the second capping layer 48 are selectively etched away. The resultant exposed surface of the p-cladding layer 47 after the formation of the window structures is clean and flat. Thus, the manufacturing method allows the window structures to be formed without adversely affecting the subsequent crystal growth.

According to the present embodiment, since the first capping layer 49 (formed before forming the window structures) is made of GaAs, the layer prevents phosphorus (P) from leaving the underlying second capping layer 48 and thereby prevents a change in the composition of the second cladding layer 48. This ensures that the second capping layer 48 can be selectively etched relative to the underlying p-cladding layer 47. As a result, the surface of the p-cladding layer 47 that has been exposed by etching away the second capping layer 48 is clean and flat.

After removing the capping layers from the semiconductor structure as described above, the method forms a p-cladding layer 52, etc. over it to produce the semiconductor structure specified in FIG. 12. The p-cladding layer 52 and the overlying layers are formed in the same manner as the p-cladding layer 12 and the overlying layers described in connection with the first embodiment and with reference to FIG. 3. Thus, the method of the present embodiment can produce a semiconductor optical device with window structures in such a way that the device has no crystal defects due to residual material left after the formation of the window structures.

Although the first capping layer has been described as being made of GaAs, the layer may be formed of any suitable material that allows it to be selectively etched relative to the underlying second capping layer and that prevents a change in the composition of the second capping layer. Further, although the first capping layer has been described as being etched using an ammonium hydroxide/peroxide mixture, the layer may be etched by any suitable chemical solution that allows it to be selectively etched relative to the underlying second capping layer.

Although the second capping layer has been described as being made of InGaP, the layer may be made of any suitable material that allows it to be selectively etched relative to the underlying p-cladding layer. Further, although the second capping layer has been described as being etched using hydrochloric acid, the layer may be etched by any suitable chemical solution that allows it to be selectively etched relative to the underlying p-cladding layer.

Further, although the second capping layer has been described as being made of InGaP, the layer may be made of InGaAsP, which also allows the first capping layer to be selectively etched using an ammonium hydroxide/peroxide mixture. Further, the second capping layer made of InGaAsP can be selectively etched relative to the underlying p-cladding layer using nitric acid. That is, instead of InGaP, InGaAsP may be used to form the second capping layer, with the same effect.

Third Embodiment

Figure 14:
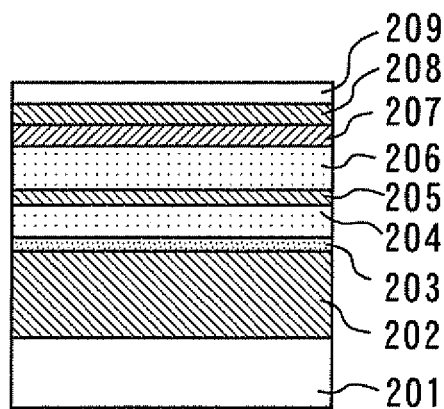
FIG. 14 is an elevational view of a semiconductor structure formed by manufacturing method of third embodiment.

A third embodiment of the present invention provides a method for manufacturing a semiconductor optical device while preventing penetration of fluorine into the device. FIG. 14 is an elevational view of a semiconductor structure formed by this manufacturing method. The method fabricates the semiconductor optical device by forming semiconductor layers on top of one another over an n-type GaAs substrate 201 in the following manner. First, an n-type AlGaAs cladding layer 202 is formed on and in contact with the n-type GaAs substrate 201. This step is hereinafter referred to as the "n-type cladding layer forming" step. Next, a multiquantum well (MQW) active layer 203 (hereinafter referred to simply as "active layer 203") made up of an undoped AlGaAs multilayer film (or layer stack) is formed on the n-type cladding layer 202. This step is hereinafter referred to as the "active layer forming" step.

A p-type AlGaAs cladding layer 204 doped with Zn (which acts as a p-type impurity) is then formed on the active layer 203. This step is hereinafter referred to as a "p-type cladding layer forming" step. An etch stopper layer 205 is then formed on the p-type cladding layer 204. This step is hereinafter referred to as the "etch stopper layer forming" step. It should be noted that the etch stopper layer 205 is used when forming the ridge by etching later in the process. Next, a p-type AlGaAs cladding layer 206 doped with Zn (which acts as a p-type impurity) is formed on the etch stopper layer 205. This step is hereinafter referred to as a "p-type cladding layer forming" step.

An n-type GaInP layer (hereinafter referred to as "active layer protecting film 207") doped with Si (which acts as an n-type impurity) is then formed on the p-type cladding layer 206. This step is hereinafter referred to as the "active layer-protecting film-forming" step. The active layer protecting film 207 is provided to prevent penetration of fluorine into the active layer 203, etc., and described in detail later. A p-type GaAs capping layer 208 doped with Zn (which acts as a p-type impurity) is then formed on the active layer protecting film 207. This step is hereinafter referred to as the "capping layer forming" step.

The above layers are formed, for example, by MOCVD (Metal Organic Chemical Vapor Deposition). For example, they are formed by MOCVD at a growth temperature of 700° C. under a growth pressure of 100 mbar. The source gases used to form each layer include trimethyl indium (TMI), trimethyl gallium (TMG), trimethyl aluminum (TMA), phosphine ($PH_3$), arsine ($AsH_3$), silane ($SiH_4$), and diethyl zinc (DEZn). The desired composition of each layer is obtained by mixing these source gases while controlling their flow rates using mass flow controllers (MFCs), etc.

After the capping layer forming step, a silicon oxide based film 209 is formed on the capping layer 208. This film is later processed into a mask for a subsequent etching process. According to the present embodiment, the silicon oxide based film 209 is made of $SiO_x$.

Figure 15:
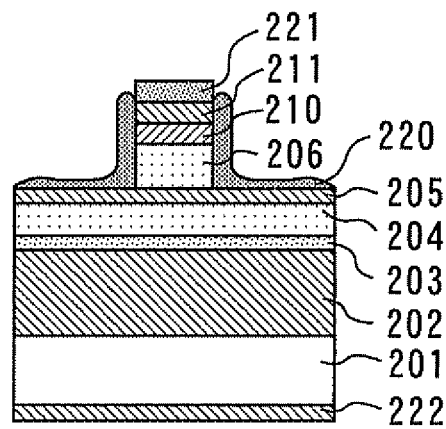
FIG. 15 is a cross-sectional view of a semiconductor laser diode produced by further processing the semiconductor structure shown in FIG. 14.

FIG. 15 is a cross-sectional view of a semiconductor laser diode produced by further processing the semiconductor structure shown in FIG. 14 in the following manner. First, the active layer protecting film 207 and the p-type GaAs capping layer 208 are removed by etching. Next, a p-type AlGaAs upper cladding layer 210 is formed on the p-type cladding layer 206, and a p-type GaAs capping layer 211 is formed on the p-type upper cladding layer 210. The three layers above the etch stopper layer 205 (i.e., the p-type AlGaAs cladding layer 206, the p-type AlGaAs upper cladding layer 210, and the p-type GaAs capping layer 211) are processed into a ridge shape by a ridge forming process (etching, etc.). An insulating film 220 is then formed to cover the sides (but not the end faces) of the ridge and the surfaces of the etch stopper layer 205 that have been exposed by the above ridge forming process.

Figure 16:
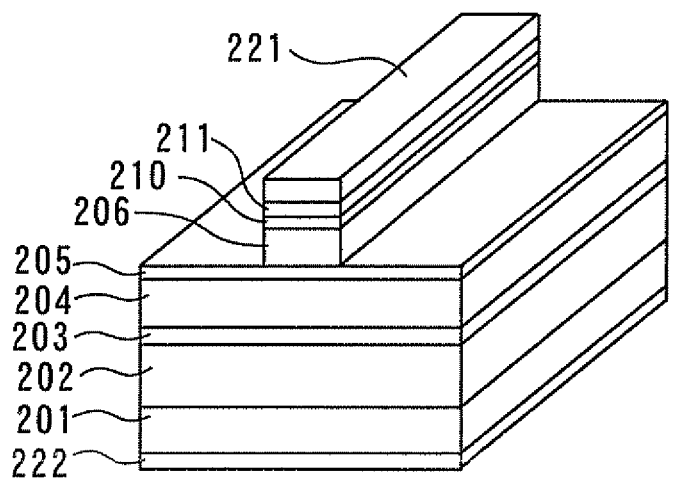
FIG. 16 is a perspective view of the semiconductor laser diode shown in FIG. 15.

A p-type electrode 221 is then formed on the p-type GaAs capping layer 211, and an n-type electrode 222 is formed on and in contact with the bottom surface of the n-type GaAs substrate 201, thus completing the formation of the semiconductor laser diode (i.e., a semiconductor optical device of the present embodiment). FIG. 16 is a perspective view of the semiconductor laser diode shown in FIG. 15. It should be noted that the insulating film 220 is omitted from FIG. 16.

Figure 17:
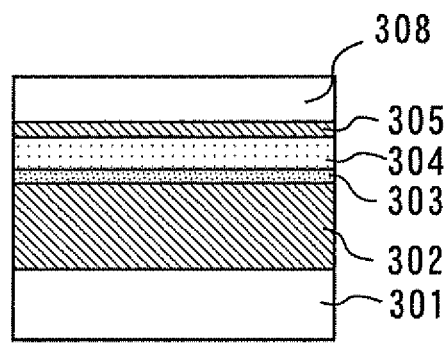
FIG. 17 is semiconductor structure explaining comparative method for manufacturing a semiconductor optical device of third embodiment.

To better understand the features of the present embodiment, it will be helpful to describe another comparative method for manufacturing a semiconductor optical device with reference to FIG. 17. The following description will be directed to the differences from the manufacturing method of the present embodiment to avoid undue repetition. First, an n-type cladding layer 302 doped with Si (which acts as an n-type impurity) is formed on an n-type GaAs substrate 301. Next, an active layer 303 of AlGaAs, etc. having an MQW structure is formed on the n-type cladding layer 302. A p-type AlGaAs cladding layer 304 doped with Zn (which acts as a p-type impurity) is then formed on the active layer 303. A p-type GaAs capping layer 305 doped with Zn (which acts as a p-type impurity) is then formed on the p-type AlGaAs cladding layer 304. These layers are formed, for example, by MOCVD using source gases as described above.

Next, a silicon oxide based film 308 is formed on the p-type GaAs capping layer 305. The silicon oxide based film 308 is made of $SiO_x$. It is later processed into a mask for a subsequent etching process.

Manufacturing methods for semiconductor optical devices such as semiconductor laser diodes generally include a process of forming a silicon oxide based film as described above. Since the coating apparatus for forming such a silicon oxide based film is commonly maintained by using fluorine, a certain amount of fluorine is inevitably left within the apparatus. If the silicon oxide based film is formed in such a apparatus (containing a certain amount of fluorine), the fluorine may penetrate into the semiconductor optical device being manufactured, since such a film forming process is carried out under elevated temperature conditions.

Further, the environment surrounding the manufacturing line also contains fluorine, which may penetrate into the semiconductor optical device being manufactured. If such penetration has occurred, it may cause crystal defects or crystal transitions within components or layers that determine the characteristics of the semiconductor optical device, such as the active and cladding layers. It should be noted that the active and cladding layers greatly tend to suffer such crystal defects and crystal transitions if they contain Al. The crystal defects and crystal transitions due to penetration of fluorine may degrade the characteristics and reliability of the semiconductor optical device, as has happened in the past.

An ideal solution to this problem is to avoid the use of fluorine for the maintenance of the coating apparatus and to remove fluorine from the environment surrounding the manufacturing line. However, the maintenance of the coating apparatus requires fluorine and it is difficult to completely remove fluorine from the environment around the manufacturing line. That is, with the above comparative method for manufacturing a semiconductor optical device, it is difficult to overcome the above problem of penetration of fluorine, which may result in degraded characteristics and reliability of the semiconductor optical device.

With the method of the present embodiment for manufacturing a semiconductor optical device, on the other hand, it is possible to avoid the above problem of penetration of fluorine into the device. Specifically, according to the present embodiment, the active layer protecting film 207 prevents penetration of fluorine into the underlying layers (active and cladding layers, etc.) when the silicon oxide based film 209 is formed and in the subsequent process steps. That is, since the active layer protecting film 207 lies over the n-type AlGaAs cladding layer 202, the active layer 203, the p-type AlGaAs cladding layer 204, and the p-type AlGaAs cladding layer 206 (all including Al), the film prevents penetration of fluorine into these layers. Therefore, even if the coating apparatus and the environment surrounding the manufacturing line contain fluorine, the active layer protecting film 207 prevents it from aversely affecting the characteristics and reliability of the semiconductor optical device. Furthermore, with the manufacturing method of the present embodiment, since the active layer protecting film 207 is selectively etched away relative to the underlying p-type AlGaAs cladding layer 206, the resultant exposed surface of the p-type AlGaAs cladding layer 206 is clean and flat. This prevents the device from suffering the problem of crystal defects in its layers and the resultant reduction in yield. Further, the above clean and flat surface of the p-type AlGaAs cladding layer 206 allows the subsequent p-type cladding layer (i.e., the p-type AlGaAs upper cladding layer 210) to be epitaxially grown thereon.

It should be noted that the silicon oxide based film 209 (of $SiO_x$) may be replaced by a silicon nitride based film of SiN, etc. with the same effect, since such a film also prevents penetration of fluorine into the semiconductor optical device under elevated temperature conditions.

Although the active layer protecting film 207 has been described as being made of n-type GaInP, it may be made of AlGaInP, GaInP, or InGaAsP with the same effect, since such a material also prevents penetration of fluorine into the semiconductor optical device. That is, the active layer protecting film may be any suitable phosphorus based Group III-V semiconductor layer.

Figure 18:
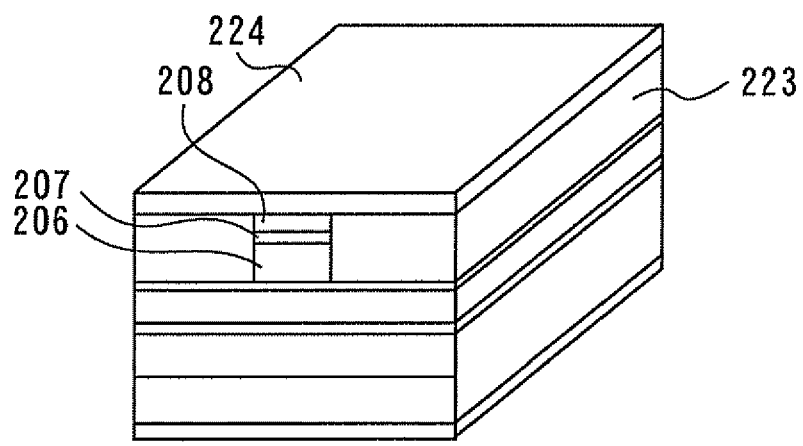
FIG. 18 shows the buried laser with a current constricting structure.

Although the method of the present embodiment for manufacturing a semiconductor optical device has been described with reference to the ridge waveguide laser shown in FIG. 16, the method is not limited to ridge waveguide lasers. This method can be applied to the buried laser with a current constricting structure shown in FIG. 18, since the method is characterized by forming an active layer protecting film to prevent penetration of fluorine into the device. In the semiconductor structure shown in FIG. 18, the cutout portions on both sides of the ridge portion formed by etching are filled with a semiconductor epitaxial layer 223. Further, a p-type electrode 224 covers the entire top surfaces of the semiconductor epitaxial layer 223 and the ridge portion that includes layers 206, 207, and 208.

Figure 19:
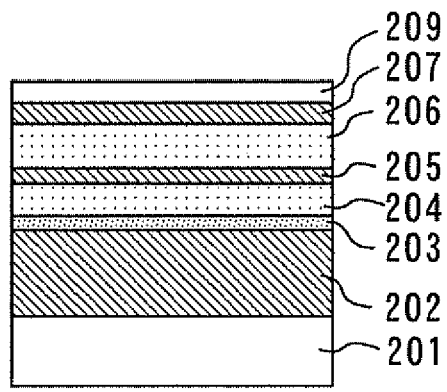
FIG. 19 shows the laser of third embodiment without capping layer.

The GaAs capping layer 208 may be omitted, while still retaining the advantages of the present invention. Specifically, after forming the layers from the GaAs substrate 201 through the active layer protecting film 207, the silicon oxide based film 209 may be formed on the active layer protecting film 207, as shown in FIG. 19. This arrangement also allows the active layer protecting film 207 to have the effect described above.

Figure 20:
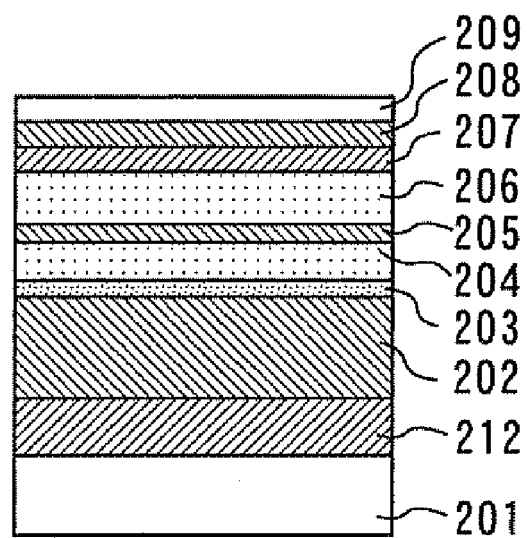
FIG. 20 shows a possible variation of third embodiment.

In the present embodiment, the GaAs capping layer 208, the AlGaAs cladding layer 206, and the AlGaAs cladding layer 204 are of p-type conductivity, while the active layer protecting film 207 and the AlGaAs cladding layer 202 are of n-type conductivity. In other embodiment, however, their conductivity types may be reversed, with the same effect. Further, each layer may be formed of any other suitable material while still allowing the active layer protecting film to prevent penetration of fluorine into the underlying layers. That is, these layers may be of any conductivity type and made of any suitable material except that the active layer protecting film 207 must be a phosphorus based Group III-V semiconductor layer. For example, as shown in FIG. 20, a lower cladding layer 212 made of n-type GaInP, n-type AlGaInP, or n-type InGaAsP may be formed on the GaAs substrate 201, and then the layers from the n-type AlGaAs cladding layer 202 through the silicon oxide based film 209 may be formed on top of one another.

Fourth Embodiment

Figure 21:
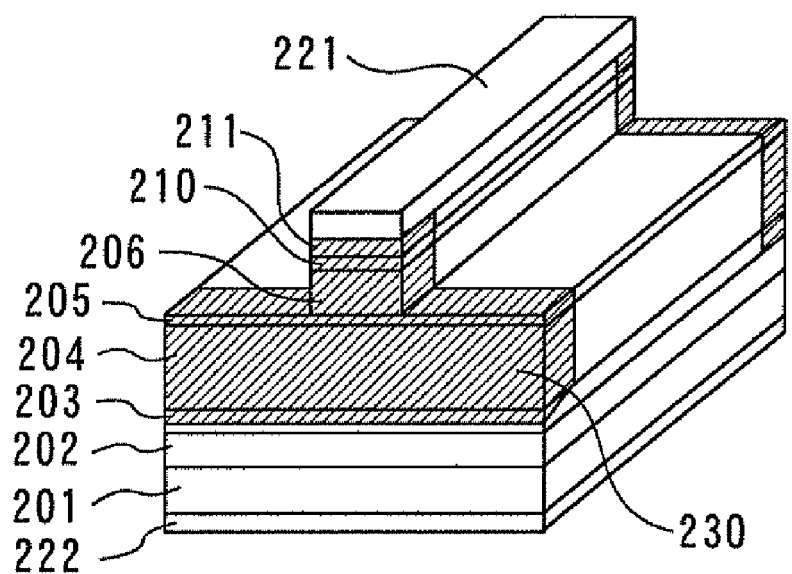
FIG. 21 is a perspective view of the completed semiconductor optical device of fourth embodiment.

A fourth embodiment of the present invention provides a method for manufacturing a semiconductor optical device with window structures while preventing penetration of fluorine into the device. This manufacturing method will be described with reference to FIG. 21. FIG. 21 is a perspective view of the completed semiconductor optical device. It should be noted that in FIG. 21 layers common to FIG. 16 are designated by the same reference numerals to avoid undue repetition. (These layers are formed of the same materials and in the same manner as described in connection with the third embodiment.) Further, the method of the present embodiment for manufacturing a semiconductor optical device includes the steps described in connection with the third embodiment, in addition to a window structure forming step.

The semiconductor optical device shown in FIG. 21 differs from that shown in FIG. 16 in that it includes a window structure 230 in its laser beam emitting end face. The window structure 230 is formed by disordering the emitting end face portion of the active layer 203, etc., and thereby increasing the bandgap. Specifically, after forming an active layer protecting film (a phosphorus based Group III-V semiconductor layer), a capping layer, and a silicon oxide based film, as in the third embodiment, Si is diffused through the silicon oxide based film into the active layer 203 to disorder the active layer. (The active layer protecting film, the capping layers and the silicon oxide based film are similar to those of the third embodiment.) It should be noted that the Si must diffuse through the active layer protecting film and the capping layer to reach the active layer 203. Therefore, whether or not the active layer 203 can be sufficiently disordered by Si diffusion depends greatly on the thicknesses of the active layer protecting film and the capping layer.

In order to sufficiently disorder the active layer 203, it is necessary to reduce the thicknesses of the active layer protecting film and the capping layer. However, too much reduction in these thicknesses makes it impossible to prevent penetration of fluorine into the semiconductor optical device. Therefore, the active layer protecting film and the capping layer must be formed to such thicknesses as to allow the active layer, etc. to be disordered by Si diffusion and to prevent penetration of fluorine into the semiconductor optical device. According to the present embodiment, the sum of the thicknesses of the active layer protecting film and the capping layer is 15 nm or less, considering the above requirements. Further, the thicknesses of the capping layer and the active layer protecting film are preferably 5-10 nm.

Thus, according to the present embodiment, the thicknesses of the active layer protecting film and the capping layer are 5-10 nm, and their combined thickness is 15 nm or less. This allows the active layer, etc. to be disordered by Si diffusion while at the same time preventing penetration of fluorine into the semiconductor optical device.

According to the present embodiment, the thicknesses of the active layer protecting film and the capping layer are 5-10 nm, and the sum of these thicknesses is 15 nm or less. However, in other embodiments in which the capping layer is omitted, the active layer protecting film may have a thickness of 15 nm or less to allow the end faces of the active layer to be disordered by Si diffusion and to prevent penetration of fluorine into the device. It should be noted that the thickness of the active layer protecting film is more preferably 2-15 nm.

The present invention allows elimination or reduction of the amount of residual material left after the formation of window structures in a semiconductor optical device, as well as preventing penetration of fluorine into the device.

Obviously many modifications and variations of the present invention are possible in the light of the above teachings. It is therefore to be understood that within the scope of the appended claims the invention may be practiced otherwise than as specifically described.

The entire disclosure of Japanese Patent Applications No. 2007-106940, filed on Apr. 16, 2007, and No. 2007-219687, filed on Aug. 27, 2007 including specification, claims, drawings, and abstract, on which the Convention priority of the present application is based, are incorporated herein by reference in their entirety.

What is claimed is:

1. A method for manufacturing a semiconductor optical device, comprising, sequentially:
   forming a p-type cladding layer;
   forming a capping layer on said p-type cladding layer, said capping layer being selectively etchable relative to said p-type cladding layer;
   forming a through film on said capping layer;
   forming a window structure by implanting ions through said through film and annealing, after implanting the ions;
   removing said through film after implanting the ions; and
   selectively removing said capping layer from said p-type cladding layer.

2. The method for manufacturing a semiconductor optical device as claimed in claim 1, wherein:
   forming said p-type cladding layer includes forming an AlGaAs layer;
   forming said capping layer includes forming an InGaP layer or an InGaAsP layer; and
   forming said through film includes forming a film selected from the group consisting of SiO, $SiO_2$, and SiON.

3. The method for manufacturing a semiconductor optical device as claimed in claim 2, including:
   removing said through film by etching with a chemical solution containing buffered hydrofluoric acid; and
   selectively removing said capping layer by etching with a chemical solution containing hydrochloric acid.

4. A method for manufacturing a semiconductor optical device, comprising, sequentially:
   forming a p-type cladding layer;
   forming a first capping layer on said p-type cladding layer, said first capping layer being selectively etchable relative to said p-type cladding layer;
   forming a second capping layer on said first capping layer to prevent a constituent of said first capping layer from leaving said first capping layer, said second capping layer being selectively etchable relative to said first capping layer;
   forming a through film on said second capping layer;
   forming a window structure by implanting ions through said through film and annealing, after implanting the ions;
   removing said through film after implanting the ions;
   selectively removing said second capping layer from said first capping layer; and
   selectively removing said first capping layer from said p-type cladding layer.

5. The method for manufacturing a semiconductor optical device as claimed in claim 4, wherein:
   said p-type cladding layer is AlGaAs;
   said second capping layer is GaAs;
   said first capping layer is InGaP or InGaAsP; and
   said through film is selected from the group consisting of SiO, $SiO_2$, and SiON.

6. The method for manufacturing a semiconductor optical device as claimed in claim 5, including:
   removing said through film by etching with a chemical solution containing buffered hydrofluoric acid;
   selectively removing said second capping layer by etching with a chemical solution containing an ammonium hydroxide/peroxide mixture; and
   selectively removing said first capping layer by etching with a chemical solution containing hydrochloric acid.

7. A method for manufacturing a semiconductor optical device, comprising, sequentially:
   forming an active layer supported by a substrate;
   forming a phosphorus-based Group III-V semiconductor layer supported by said active layer; and
   forming a silicon oxide-based film or a silicon nitride-based film supported by said phosphorus-based Group III-V semiconductor layer.

8. The method for manufacturing a semiconductor optical device as claimed in claim 7, further comprising:
   forming a cladding layer of a first conductivity type including AlGaAs before forming said active layer;
   forming an AlGaAs cladding layer of a second conductivity type after forming said active layer and before forming said phosphorus-based Group III-V semiconductor layer; and
   forming said active layer of AlGaAs.

9. The method for manufacturing a semiconductor optical device as claimed in claim 8, further comprising:
   forming a capping layer of said second conductivity type after forming said second conductivity type cladding layer and before forming said phosphorus-based Group III-V semiconductor layer; and
   diffusing a material through said phosphorus-based Group III-V semiconductor layer and said capping layer to form a window structure, wherein
      said capping layer and said phosphorus-based Group III-V semiconductor layer each have a thickness of 5 to 10 nm, and
      the sum of the thicknesses of said capping layer and said phosphorus-based Group III-V semiconductor layer is no more than 15 nm.

10. The method for manufacturing a semiconductor optical device as claimed in claim 7, further comprising diffusing a material through said phosphorus-based Group III-V semiconductor layer to form a window structure, wherein said phosphorus-based Group III-V semiconductor layer has a thickness of no more than 15 nm.

11. The method for manufacturing a semiconductor optical device as claimed in claim 8, wherein said phosphorus-based Group III-V semiconductor layer is of said first conductivity type.

12. The method for manufacturing a semiconductor optical device as claimed in claim 7, wherein said phosphorus-based Group III-V semiconductor layer is selected from the group consisting of AlGaInP, GaInP, and InGaAsP.

13. The method for manufacturing a semiconductor optical device as claimed in claim 7, further comprising removing said phosphorus-based Group III-V semiconductor layer.

14. The method for manufacturing a semiconductor optical device as claimed in claim 8, further comprising:
   removing said phosphorus-based Group III-V semiconductor layer; and
   growing an epitaxial layer on said AlGaAs cladding layer after removing said phosphorus-based Group III-V semiconductor layer, wherein forming a phosphorus-based Group III-V semiconductor layer includes epitaxially growing said phosphorus-based III-V Group semiconductor layer.

* * * * *